United States Patent
Palaniswamy et al.

(10) Patent No.: US 12,004,424 B2
(45) Date of Patent: Jun. 4, 2024

(54) FLEXIBLE THERMOELECTRIC DEVICE

(71) Applicant: 3M INNOVATIVE PROPERTIES COMPANY, St. Paul, MN (US)

(72) Inventors: Ravi Palaniswamy, Chao Chu Kang (SG); Antonny Flor, Singapore (SG); Sheldon B. Ruiz, Singapore (SG); Milind B. Sabade, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 24 days.

(21) Appl. No.: 17/779,623

(22) PCT Filed: Dec. 6, 2019

(86) PCT No.: PCT/US2019/064957
§ 371 (c)(1),
(2) Date: May 25, 2022

(87) PCT Pub. No.: WO2021/112873
PCT Pub. Date: Jun. 10, 2021

(65) Prior Publication Data
US 2023/0019334 A1  Jan. 19, 2023

(51) Int. Cl.
*H10N 10/01* (2023.01)
*H10N 10/13* (2023.01)
(Continued)

(52) U.S. Cl.
CPC .............. *H10N 10/01* (2023.02); *H10N 10/13* (2023.02); *H10N 10/17* (2023.02); *H10N 10/852* (2023.02); *H10N 10/855* (2023.02)

(58) Field of Classification Search
CPC ...... H10N 10/01; H10N 10/852; H10N 10/13; H10N 10/17; H10N 10/855
See application file for complete search history.

(56) References Cited

U.S. PATENT DOCUMENTS

| 3,559,437 A | 2/1971 | Withers et al. |
|---|---|---|
| 2003/0145605 A1 | 8/2003 | Moon et al. |

(Continued)

FOREIGN PATENT DOCUMENTS

| CA | 2880631 A1 | 2/2014 |
|---|---|---|
| CN | 103057449 A | 4/2013 |

(Continued)

OTHER PUBLICATIONS

International Search Report for PCT International Application No. PCT/US2019/064957, mailed on Mar. 12, 2020, 4 pages.

*Primary Examiner* — Tae-Sik Kang
(74) *Attorney, Agent, or Firm* — Steven A. Bern

(57) ABSTRACT

The present disclosure relates to a method of fabricating a thermoelectric device. The method includes disposing a metal layer on a dielectric layer to form a sub-assembly, forming patterned circuits on the metal layer, forming blind vias in the dielectric layer, fabricating first thermoelectric elements in a first series of blind vias, and fabricating second thermoelectric elements in a second series of blind vias to form thermoelectric units with the first thermoelectric elements and the patterned circuits. The sub-assembly is configured to be joined to an adjacent sub-assembly along a first direction, and the first and second thermoelectric elements of each thermoelectric unit are aligned in a second direction substantially perpendicular to the first direction. The present disclosure further relates to a thermoelectric device which includes a plurality of thermoelectric units forming a strip extending in a first direction.

14 Claims, 10 Drawing Sheets

(51) Int. Cl.
  *H10N 10/17* (2023.01)
  *H10N 10/852* (2023.01)
  *H10N 10/855* (2023.01)

(56) References Cited

U.S. PATENT DOCUMENTS

| | | |
|---|---|---|
| 2006/0048519 A1 | 3/2006 | Childress et al. |
| 2009/0055987 A1* | 3/2009 | Becker .................. A62B 18/003 |
| | | 2/209.13 |
| 2014/0123683 A1 | 5/2014 | Hou et al. |
| 2014/0371946 A1 | 12/2014 | Kwak et al. |
| 2016/0163949 A1* | 6/2016 | Stark .................... H10N 10/817 |
| | | 438/54 |
| 2017/0170380 A1 | 6/2017 | Kim et al. |
| 2018/0056835 A1 | 3/2018 | Konrad et al. |

FOREIGN PATENT DOCUMENTS

| | | |
|---|---|---|
| CN | 104048375 B | 6/2016 |
| CN | 107046092 A | 8/2017 |
| CN | 107242648 A | 10/2017 |
| FR | 2857470 B1 | 10/2005 |
| GB | 1007436 A | 10/1965 |
| KR | 20040045667 A | 6/2004 |
| KR | 20070115312 A | 12/2007 |
| KR | 20080052872 A | 6/2008 |
| KR | 100861005 B1 | 9/2008 |
| WO | 1985004948 A1 | 11/1985 |
| WO | 1999066275 A1 | 12/1999 |
| WO | 2008085172 A1 | 7/2008 |
| WO | 2019130187 A1 | 7/2019 |
| WO | 2019186314 A1 | 10/2019 |

* cited by examiner

FLEXIBLE THERMOELECTRIC DEVICE

CROSS REFERENCE TO RELATED APPLICATIONS

This application is a national stage filing under 35 U.S.C. 371 of PCT/US2019/064957, filed 6 Dec. 2019, the disclosure of which is incorporated by reference in its entirety herein.

FIELD OF INVENTION

The present invention relates broadly, but not exclusively, to thermoelectric devices and method of fabricating the same.

BACKGROUND

A thermoelectric device is a semiconductor-based, solid-state device that can convert a temperature difference into electrical energy, in which voltage is generated through Seebeck effect. When multiple units of thermoelectric devices are electrically connected in series, a high voltage output can be obtained. Alternatively, a thermoelectric device can be used for modifying temperature using electrical energy.

Current thermoelectric device industries focus mainly on the rigid thermoelectric devices based on ceramic substrates. However, such thermoelectric devices are not suitable for applications involving non-flat surfaces, such as curved surfaces, tubes etc. In particular, while there is growing interest in using thermoelectric devices to convert body heat into electrical energy or use electrical energy for cooling, the application of rigid thermoelectric devices in wearable electronics is limited by their rigidity. Besides the disadvantages caused by the rigidity of the ceramic substrate, high thermal resistance from the ceramic substrate to the circuit where the thermoelectric elements are attached will reduce the thermoelectric performance.

Flexible thermoelectric devices have been designed, where the N-type and P-type thermoelectric elements are placed in the same axis with the bending direction of the flexible thermoelectric devices. However, in conventional designs, such as one shown in FIGS. 1A and 1B, compression and tension forces created during bending acts on different directions of the thermoelectric elements, solder joints and the flexible circuit connecting the thermoelectric elements. This causes issues of cracks on the solder joints, broken thermoelectric elements and peeling of the flexible circuit. Furthermore, conventional flexible circuits are typically limited to 500 mm in length only due to standard UV exposure size for photoresist patterning.

A need therefore exists to provide solutions that seek to address at least one of the problems above or to provide a useful alternative.

SUMMARY

According to a first aspect of the present disclosure, there is provided a method of fabricating a thermoelectric device. The method includes:
- disposing a metal layer on a dielectric layer to form a sub-assembly;
- forming patterned circuits on the metal layer;
- forming blind vias in the dielectric layer;
- fabricating first thermoelectric elements in a first series of blind vias; and
- fabricating second thermoelectric elements in a second series of blind vias to form thermoelectric units with the first thermoelectric elements and the patterned circuits, wherein the sub-assembly is configured to be joined to an adjacent sub-assembly along a first direction, and wherein fabricating the first and second thermoelectric elements comprises aligning the first and second thermoelectric elements of each thermoelectric unit in a second direction substantially perpendicular to the first direction.

The step of forming the patterned circuits may include forming a first patterned photo-resist layer on the metal layer, disposing a metal on the metal layer based on the first patterned photo-resist layer, and removing the photo-resist layer and non-functional metal from the sub-assembly.

The step of forming the first patterned photo-resist layer on the metal layer may include providing a first photomask, and aligning registration spots of the first photomask with corresponding registration holes of the metal layer.

The step of forming the blind vias may include forming a second patterned photo-resist layer on the dielectric layer, and removing the dielectric layer.

The step of forming the second patterned photo-resist layer on the dielectric layer may include providing a second photomask, and aligning registration spots of the second photomask with corresponding registration holes of the dielectric layer.

The method in accordance with the first aspect may further include joining multiple sub-assemblies to form an assembly extending in the first direction before forming the patterned circuits and blind vias. The step of joining the multiple sub-assemblies includes aligning markers on an edge of one sub-assembly with corresponding markers on an adjoining edge of another sub-assembly.

Additionally, the method may further include forming through vias in the dielectric layer at the step of forming blind vias to form a gap between the two adjacent sub-assemblies.

The step of fabricating first and second thermoelectric elements may include screen printing of the first and second thermoelectric elements.

The method may further include providing metal contacts to connect the thermoelectric units within the sub-assembly in series. In one implementation, the ends of adjacent sub-assemblies may be connected in series in a serpentine arrangement.

The dielectric layer may be made of a material selected from a group consisting of polyimide, polyesters, thermoplastic polyimide, polyamide, polyolefin film, liquid crystalline polymer film, and flexible FR4 based film. The first thermoelectric element may be made of a material selected from a group consisting of bismuth telluride, silicon germanium, calcium cobalt oxides based materials, sodium cobalt oxides based materials, and strontium titanium oxides based materials. The second thermoelectric element may be made of a material selected from a group consisting of antimony telluride, lead tellurides, and $Mg_2X$ (X=Si, Ge, and Sn) based materials.

According to a second aspect of the present disclosure, there is provided a thermoelectric device. The thermoelectric device includes a plurality of thermoelectric units forming a strip extending in a first direction, wherein first and second thermoelectric elements of each thermoelectric unit are aligned in a second direction substantially perpendicular to the first direction. The length of the thermoelectric device may be more than 3 meters.

According to a third aspect of the present disclosure, there is provided a wearable device which includes the thermoelectric device in accordance with the second aspect. The wearable device may include a headgear, and the thermoelectric device may be configured to modify a temperature of an air flow to be dispensed to a wearer of the headgear.

BRIEF DESCRIPTION OF THE DRAWINGS

Embodiments of the invention are provided by way of example only, and will be better understood and readily apparent to one of ordinary skill in the art from the following written description and the drawings, in which.

DETAILED DESCRIPTION

Figure 1A:
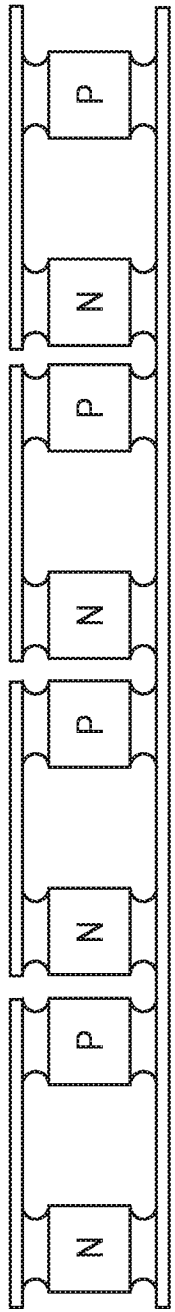
FIG. 1A shows a schematic diagram of a side view of an existing thermoelectric device.
Figure 1B:
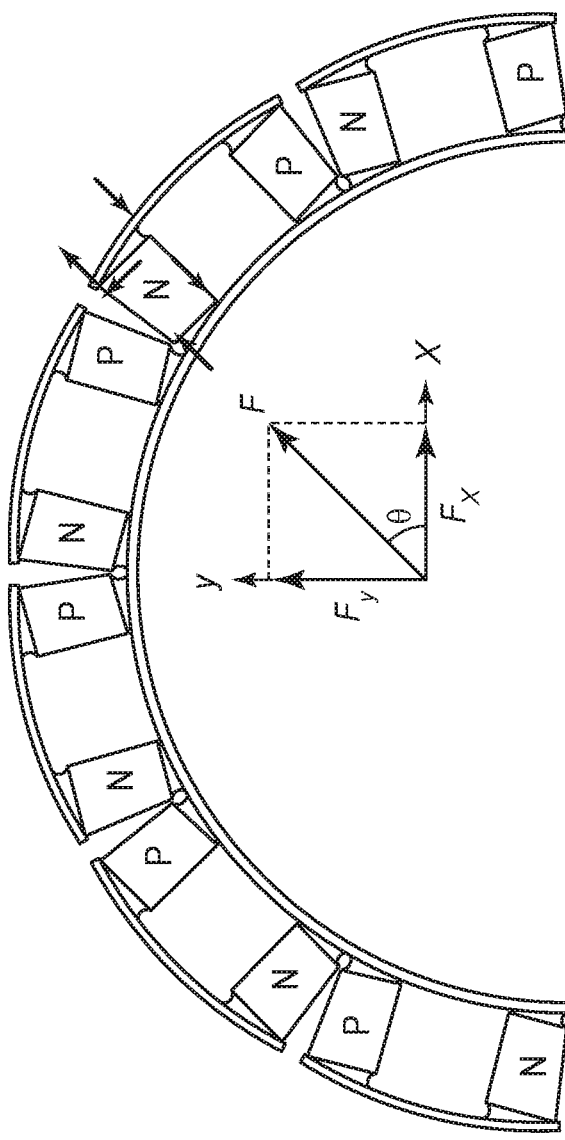
FIG. 1B shows a schematic diagram of the side view of the existing thermoelectric device of FIG. 1A in a bent form.

Embodiments of the present invention will be described, by way of example only, with reference to the drawings. Like reference numerals and characters in the drawings refer to like elements or equivalents.

Figure 2:
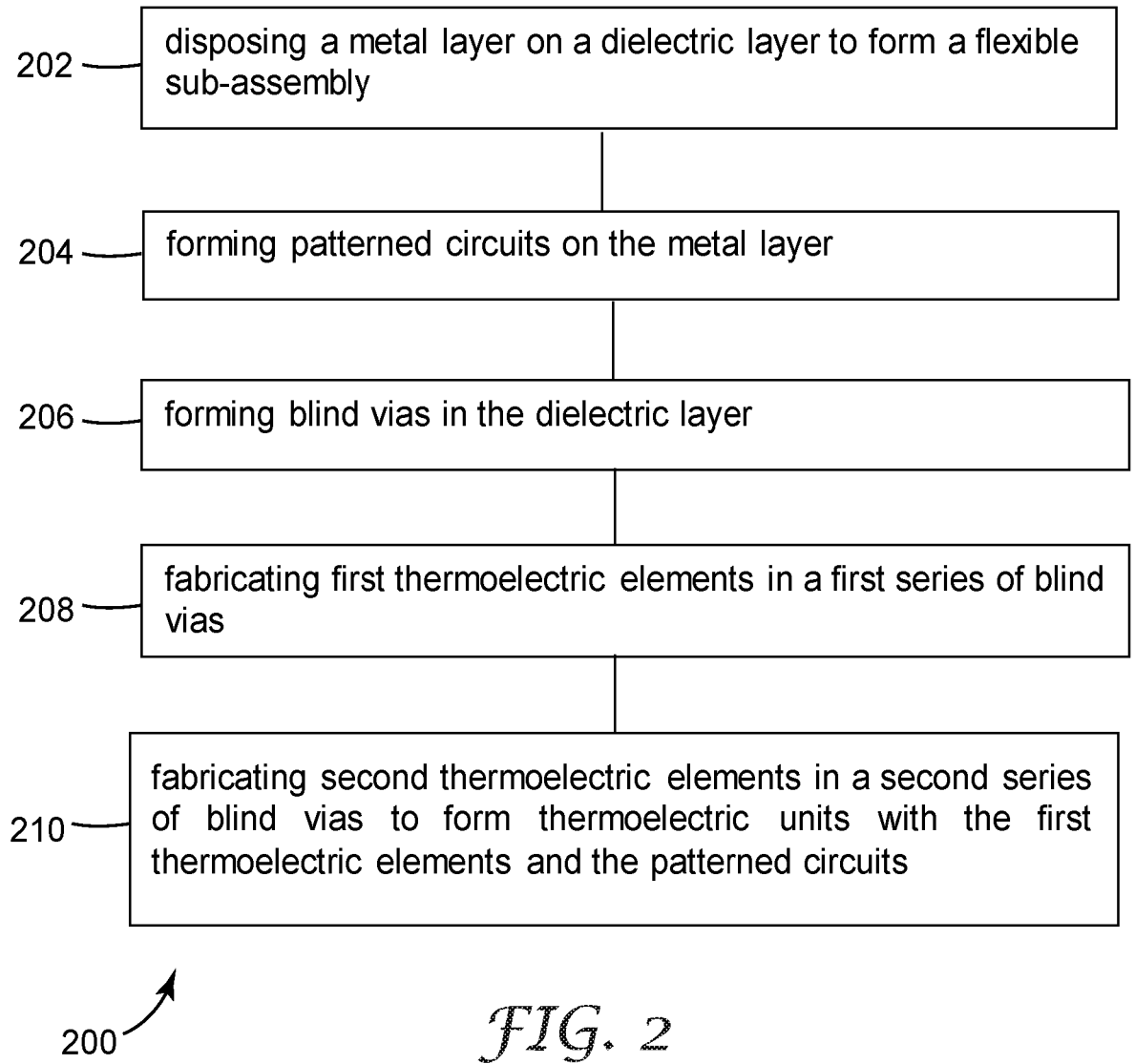
FIG. 2 shows a flowchart illustrating a method for fabricating a flexible thermoelectric device according to an example embodiment.

FIG. 2 shows a flowchart 200 illustrating a method for fabricating a flexible thermoelectric device according to an example embodiment. At step 202, a metal layer is deposited on a dielectric layer to form a flexible sub-assembly. In an example embodiment, the metal layer is made of copper (Cu) to form a flexible Cu clad substrate. At step 204, patterned circuits are formed on the metal layer using photolithographic process, which function as electrodes for connecting the thermoelectric elements. At step 206, blind vias are formed in the dielectric layer, where the thermoelectric elements are fabricated subsequently. In some embodiments, at step 206, both blind vias and through vias are formed in the dielectric layer. The through vias are arranged in a way that gaps can be created between two thermoelectric elements for improved flexibility.

At step 208, one or more first thermoelectric elements are fabricated in a first series of the blind vias formed at step 206. At step 210, one or more second thermoelectric elements are fabricated in a second series of the blind vias formed at step 206. The one or more second thermoelectric elements form one or more thermoelectric units with the one or more first thermoelectric elements fabricated at step 208, connected by the patterned circuits formed at step 204. The sub-assembly is configured to be joined to an adjacent sub-assembly along a first direction to form a strip of multiple sub-assemblies. The first and second thermoelectric elements are arranged in a manner such that the first and second thermoelectric elements of each thermoelectric unit are aligned in a second direction substantially perpendicular to the first direction.

When the strip of sub-assemblies is flexed or bent in the first direction, the tension and compression forces acting on the solder joints, the thermoelectric elements and the flexible patterned circuits can be reduced due to the alignment of the thermoelectric elements in the second direction. Additionally, the gaps formed by the through vias can further increase the flexibility and durability of the thermoelectric device.

Figure 3A:
FIGS. 3A-3K shows schematic diagrams illustrating an implementation of the method of FIG. 1.

An example implementation of the above method is now described with reference to FIG. 3. FIG. 3a shows a polyimide (PI) layer 310 provided as the dielectric layer. Thickness of the PI layer 310 can be in the range of 12.5-125 μm. One can appreciate that the dielectric layer can be made of other materials, including but not limited to thermoplastic polyimide, liquid crystalline polymer film, polyolefin film, polyester, polycarbonate, polyamide, or the like.

Figure 3B:
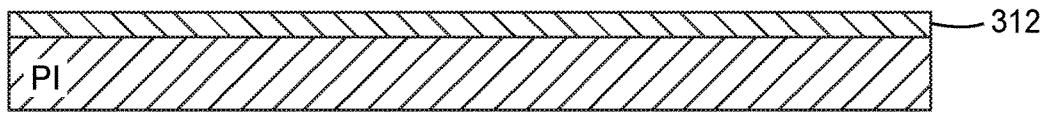

FIG. 3b shows a thin copper (Cu) layer 312 deposited on the PI layer 310 forming a flexible sub-assembly, corresponding to step 202 of the FIG. 2. The Cu layer 312 can be deposited by Cu sputtering followed by electroplating method. Thickness of the Cu layer 312 can be in the range of 5-250 μm. One can appreciate that the Cu layer 312 can be deposited by other methods, such us lamination of Cu foil film, casting of polymeric film in a molten state on the Cu foil, or the like. Besides Cu, the metal layer can be made of other materials, including but not limited to gold, silver, platinum, aluminum, and steel.

Figure 3C:
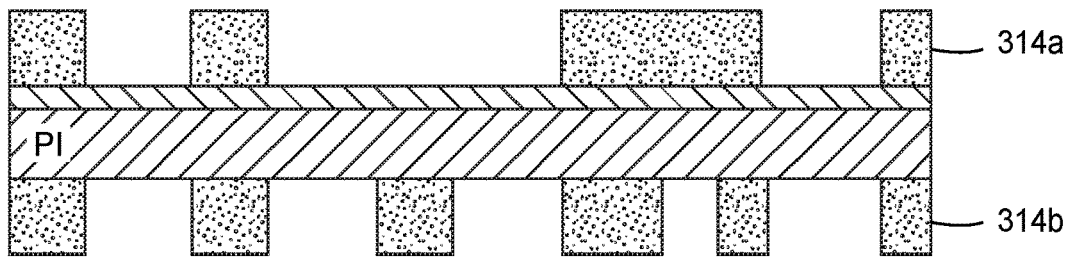

In the example embodiment, patterned circuits and blind vias are formed using a photolithography method. Photoresist is first laminated on both the top surface of the Cu layer 312 and the bottom surface of the PI layer 310, followed by UV patterning and developing to create a first patterned photoresist layer 314a (on the Cu layer 312) and a second patterned photoresist layer 314b (on the PI layer 310), as shown in FIG. 3c.

Figure 3D:
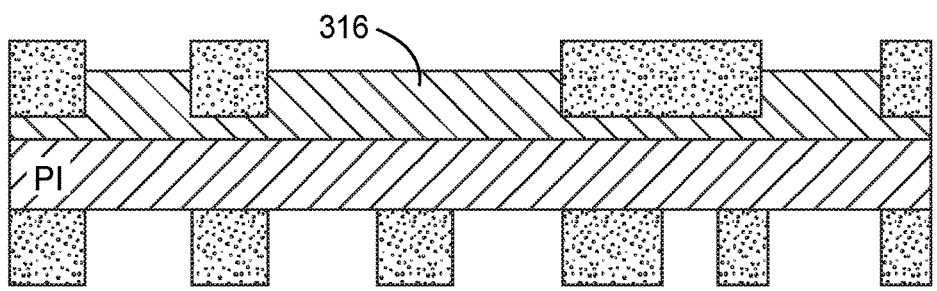

FIG. 3d shows Cu 316 deposited on the Cu layer 312 based on the first patterned photoresist layer 314a using electroplating method. In the example embodiment, Cu was deposited by Cu electroplating process. One can appreciate that the Cu can be deposited by both electroplating and electroless plating method. The function of the plated Cu 316 is to provide electrical connection between the first and second thermoelectric elements in a thermoelectric unit. Besides Cu, the deposited metal can include, but is not limited to gold, silver, platinum, aluminum and steel and is typically of the same material as the layer 312.

Figure 3E:
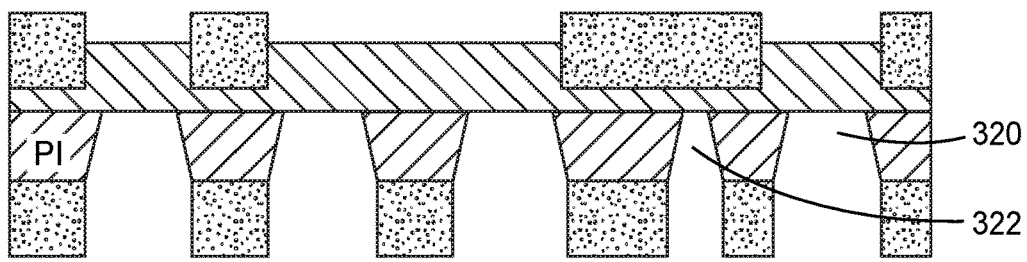

FIG. 3e shows the both blind vias 320 and through vias 322 created on PI layer 310 based on the second patterned photoresist layer 314b. In the example embodiment, the blind vias 320 and through vias 322 are created by chemical etching of PI. Besides chemical etching, there are other methods of removing the PI or other dielectric materials to create blind vias, such as mechanical punching, and laser etching. The blind via angle varies from 25-90 degree depending on the etching method. In the example embodiment, the blind via angle is typically between 25-45 degrees.

Figure 3F:
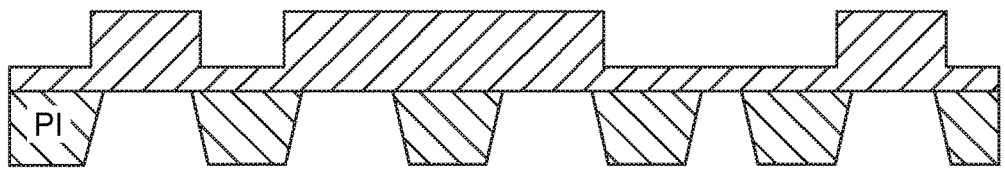

Subsequently, the first and second photoresist layers 314a, 314b are removed or stripped from the Cu layer 312 and the PI layer 310, respectively, as shown in FIG. 3f.

Figure 3G:
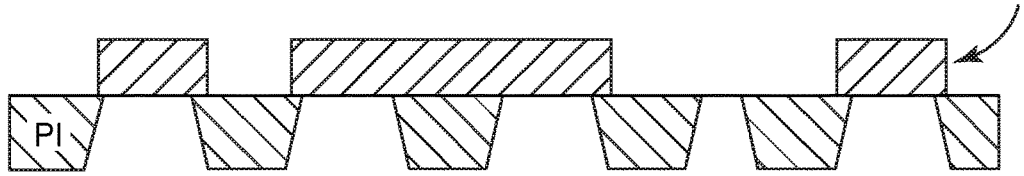

From FIG. 3f to FIG. 3g, the non-functional copper is removed from the sub-assembly. Flash etching process is used in the example embodiment to remove the non-functional copper. One can appreciate that other methods can be used such as subtractive etching using chemical process.

The patterned Cu circuits 316 and blind vias 320 in the PI layer 310 correspond to steps 204 and 206 of the method of FIG. 2. While a photoresist patterning method is used, one can appreciate that the patterned circuits 316 can be formed by other methods, such as screen printing, lithoprinting, or the like.

Figure 3H:
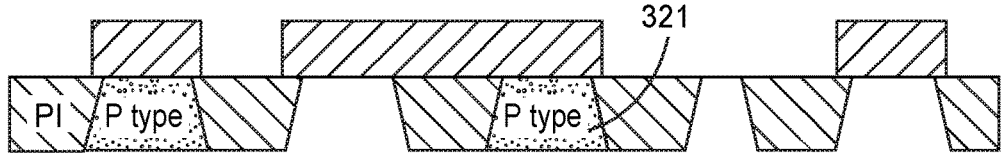

FIG. 3h shows the P-type thermoelectric elements 332 (positive) fabricated in alternating blind vias, corresponding to step 208 of the method of FIG. 2. The P-type thermoelectric elements 332 are fabricated using screen printing method, which prints P-type semiconductor ink in the alternating blind vias. Annealing process is performed after the screen print. The P-type thermoelectric elements 332 are made of a material including but not limited to bismuth telluride, homogeneous oxides such as SrTiOx, NaCo$_2$O$_4$ Ca$_3$Co$_4$O$_9$, and silicon-germanium materials.

Figure 3I:
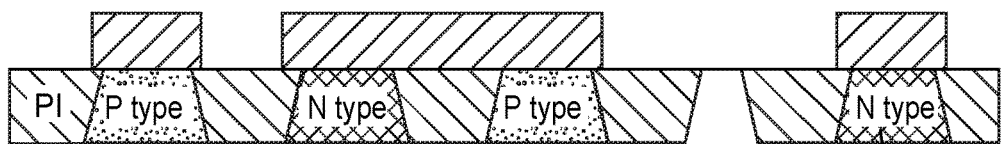

FIG. 3i shows the N-type thermoelectric elements 334 (negative) fabricated in the remaining alternating blind vias to form thermoelectric units with the P-type thermoelectric elements 332 and the patterned Cu circuits 316. The N-type thermoelectric elements 334 are fabricated using screen printing method, which prints N-type semiconductor ink in the alternating blind vias. Annealing process is performed after the screen print. The N-type thermoelectric elements 334 are made of a material including but not limited to antimony telluride, lead tellurides, and Mg$_2$X (X=Si, Ge, and Sn) based materials.

Besides screen printing method, other methods can be used to fabricate the P-type and N-type thermoelectric elements 332, 334 such as attaching the P- and N-type semiconductor chips in the range of thickness 50 μm-1.5 mm using solder, metallic paste, ACP (anisotropic conductive paste) bonding process, thermal adhesive, etc. One can also use eutectic bonding process for the gold plated P- and N-type chips with gold or silver plated circuit. When the thermoelectric elements are fabricated by the above methods, the P- and N-type semiconductor chips tend to be less flexible than the thermoelectric elements fabricated by screen printing. When joined into a flexible assembly of multiple thermoelectric units (i.e., sub-assemblies), preferably, dielectric layer between two adjacent sub-assemblies can be partially or completely etched using chemical etching process during the blind via formation. Advantageously, a gap can be created between the adjacent sub-assemblies, which increases the flexibility of the assembly so that the assembly can be bent more easily.

Figure 3J:
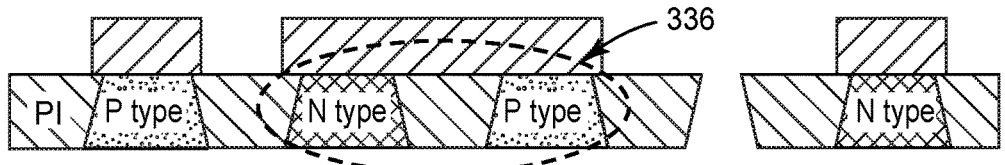

FIG. 3j shows a thermoelectric unit 336 formed by a P-type thermoelectric element 332, a N-type thermoelectric element 334, and the Cu circuit 316 (in dash circle). When the thermoelectric unit 336 is used as a generator, the Cu circuit 316 side of the thermoelectric unit 336 may be in thermal contact with the heat source. Once being heated, the P- and N-type carriers in these thermoelectric elements 332, 334 are diffused from their hot side towards their cool side due to the temperature difference. Consequentially, P-type carriers will be concentrated on the cooling side of the P-type thermoelectric element 332 while N-type carriers will be concentrated on the cooling side of the N-type thermoelectric element 334. Therefore, the electric potential at the cooling side of the thermoelectric unit 336 will be built up during heating, thus creating a thermal-electric battery.

Figure 3K:
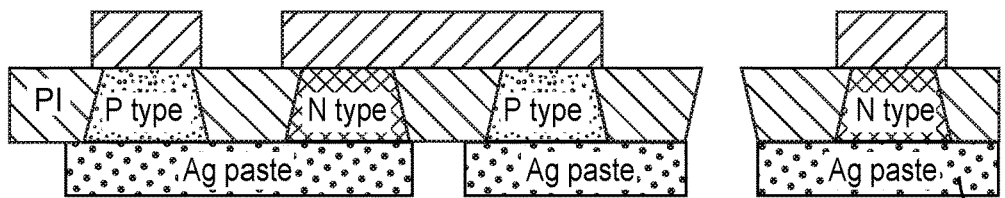

FIG. 3k shows silver (Ag) paste 340 coating, which functions to connect one P-type thermoelectric element 332 with a N-type thermoelectric element 234 of an adjacent thermoelectric unit 336 such that all thermoelectric units 336 can be connected in series. When used as a generator, a higher voltage output can be generated in a series connection. In some embodiments, ends of adjacent sub-assemblies are connected in series in a serpentine arrangement. Nevertheless, the thermoelectric units 336 can also be connected in parallel, depends on the needs and the applications. The Ag paste 340 can be applied by screen printing, direct lithoprinting, or selective plating of Ag. Besides Ag paste 340, other contacts can be used to connect the thermoelectric units 336, such as Cu paste or other similar metallic pastes.

In an example embodiment, each of the sub-assemblies as described above is configured to be joined to an adjacent sub-assembly along a first direction. When the P-type and N-type thermoelectric elements 332, 334 are fabricated, the P-type and N-type thermoelectric elements 332, 334 of each thermoelectric unit 336 are aligned in a second direction substantially perpendicular to the first direction to provide better flexibility and durability.

Figure 4A:
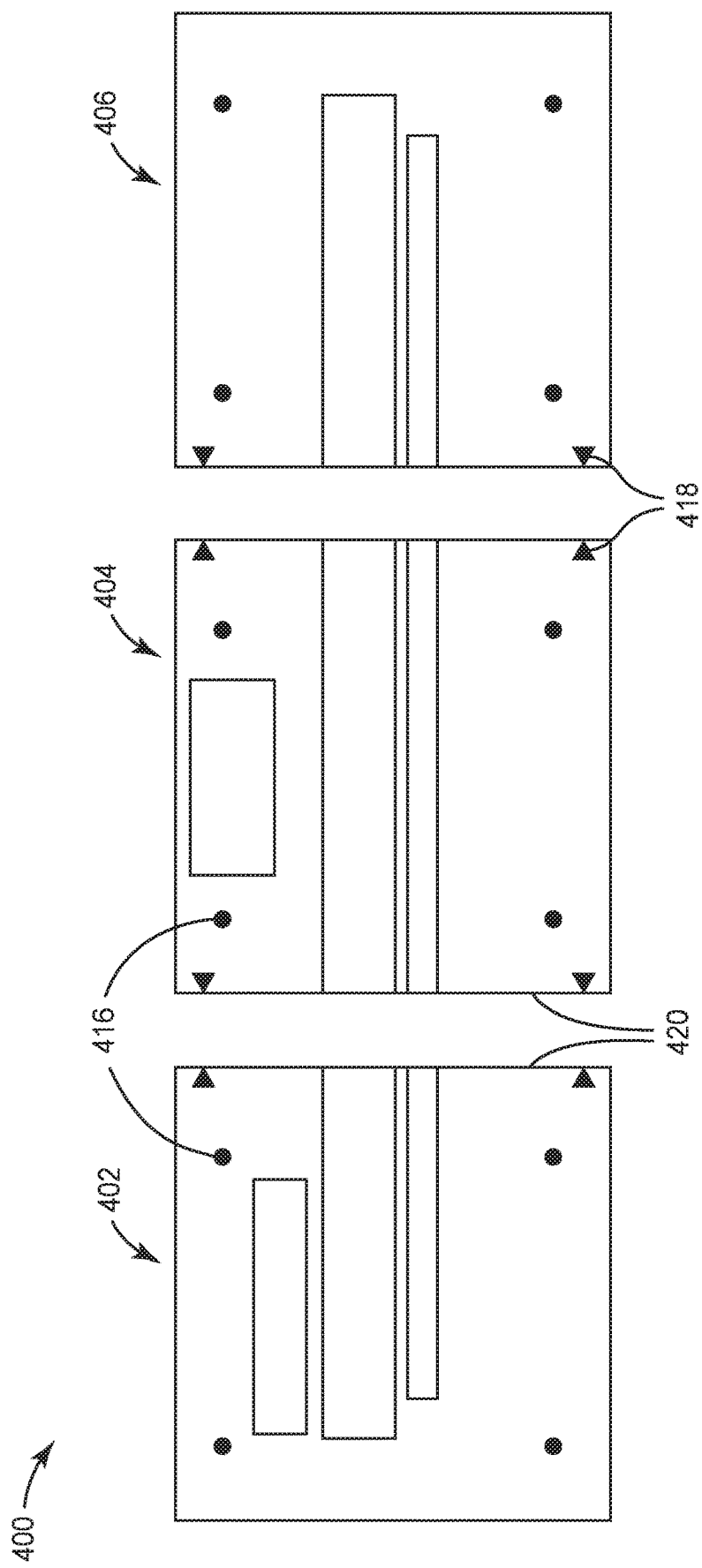
FIG. 4A shows diagrams of the top view of three sub-assemblies according to an example embodiment.

In order to make a long flexible thermoelectric device (e.g., a strip) with multiple sub-assemblies, the P-type and N-type thermoelectric elements 332, 334 need to be attached to a long flexible circuit. FIG. 4A shows diagrams of the top view of three sub-assemblies for making a 900 mm strip using a registration/alignment technique according to an example embodiment. Three photomasks 402, 404, 406 are provided with registration spots 416 and alignment markers 418 on each photomask. In the example embodiment, four registration spots are provided on each photomask, but it would be appreciated that a minimum of three spots are necessary. Photomask 402 on the left is further provided with two alignment markers close to the right edge 420, and photomask 406 on the right is further provided with two alignment markers close to the left edge. Photomask 404 in the middle is further provided with four alignment markers, two close to the left edge and two close to the right edge.

The four registration spots 416 on each photomask 402, 404, 406 are used to match the top Cu pattern with the bottom PI pattern. The alignment markers are used to align the left, middle and right Cu or PI pattern for making 900 mm strip.

Figure 4B:
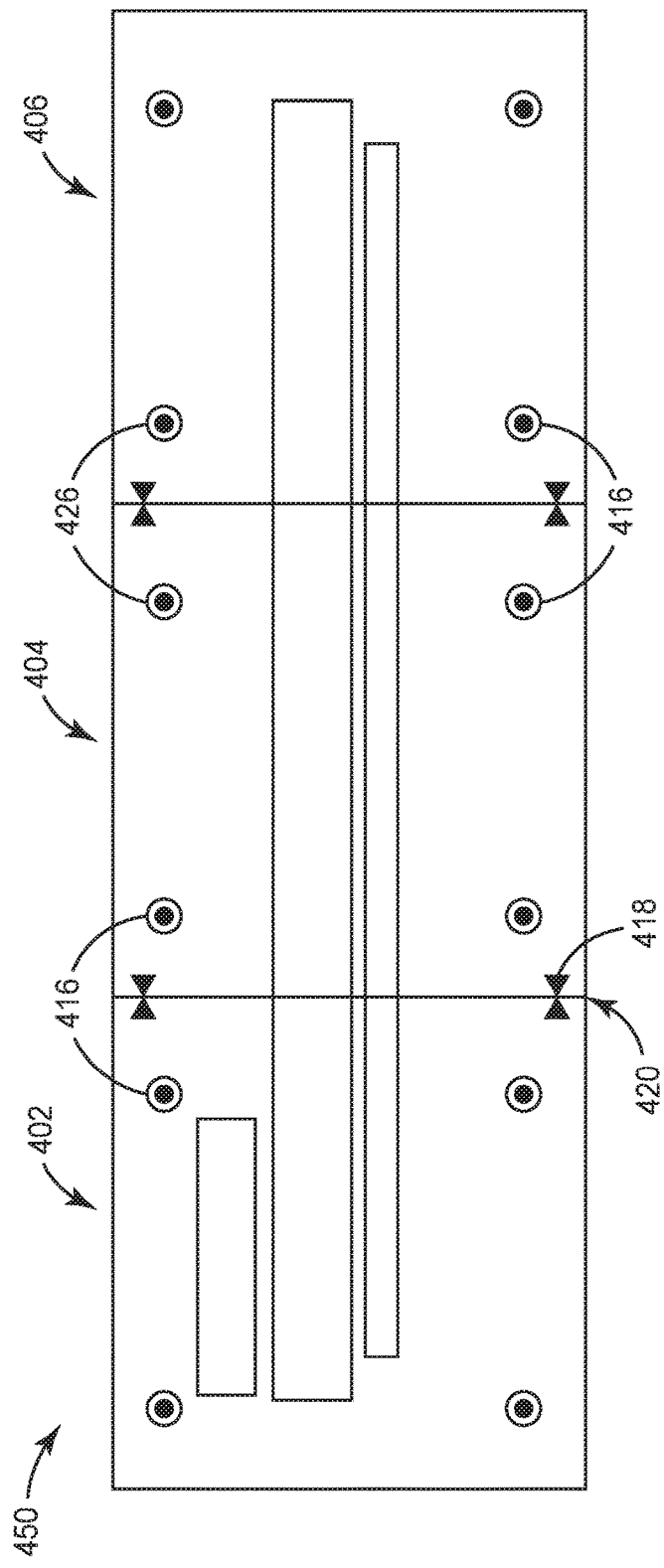
FIG. 4B shows a diagram of the top view of a strip formed by the three sub-assemblies in FIG. 4A according to the example embodiment.

FIG. 4B shows a diagram of the top view of a 900 mm flexible thermoelectric strip formed by the three sub-assemblies in FIG. 4A according to the example embodiment. Firstly, four registration holes 426 are created on each sub-assembly using a punch machine so that the related four registration spots 416 on the photomasks can be matched with the registration holes 426. The middle pattern on the middle sub-assembly 454 can be created by UV exposure, then the left and right patterns on sub-assemblies 452 and 456 can also be created with their photomasks, respectively. The alignment markers 418 are used for alignment between left, middle and right patterns of Cu or PI side. In detail, for the Cu side, the after creating middle pattern, the alignment markers 418 on this pattern can be used as reference for alignment of the left and the right pattern, which means the location of the left and the right pattern can be adjusted based on their registration spots/holes and alignment markers. Similarly, the patterns on PI side can also be created by using the same method. In addition, the matching between Cu and PI pattern can also be proceeded by these registration spots/holes.

Figure 4C:
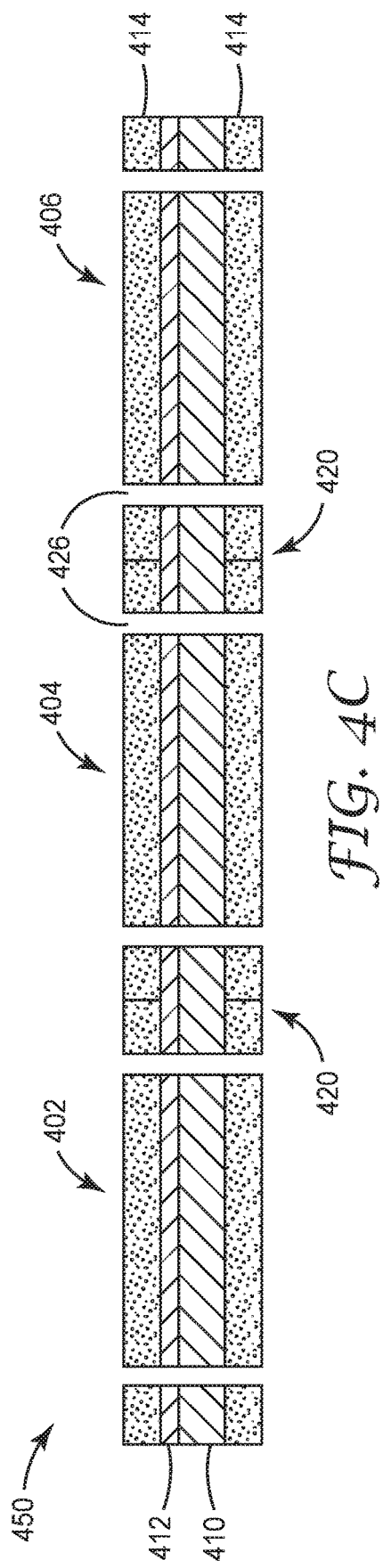
FIG. 4C shows a diagram of the cross-sectional view of the strip in FIG. 4B according to the example embodiment.

FIG. 4C shows a diagram of the cross-sectional view of the 900 mm flexible thermoelectric strip in FIG. 4B according to the example embodiment. The sub-assembly has a substrate structure of a Cu layer 412 and a PI layer 410. Photoresist layers 414 are laminated on both sides of the substrate. The registration holes 426 are created by punch machine. The left, middle and right expose patterns are aligned/matched together on both Cu layer 412 and PI layer 410 for creating the 900 mm strip. The three aligned sub-assemblies with an overall length of 900 mm as a whole is provided for depositing the Cu (FIG. 3d) and onward processing. In a preferred embodiment, the Cu deposited by Cu plating provides sufficient stability to hold the sub-assemblies together. Advantageously, no extra step of stitching or connecting is required to join the sub-assemblies.

With this method, a 900 mm flexible thermoelectric strip can be created by short length (330 mm) exposer. Longer strip, such as 3 meters or more, can be fabricated by repeating the above procedure. Besides the design of the registration spots, registration holes and alignment markers described above, designs with other shapes, number of spots/holes/markers and different distances can also be used to achieve the same effect. Besides using a punch machine, the registration holes can be created by other methods, such as laser drilling, 3D printing or screen printing to create registration marks.

Figure 5A:
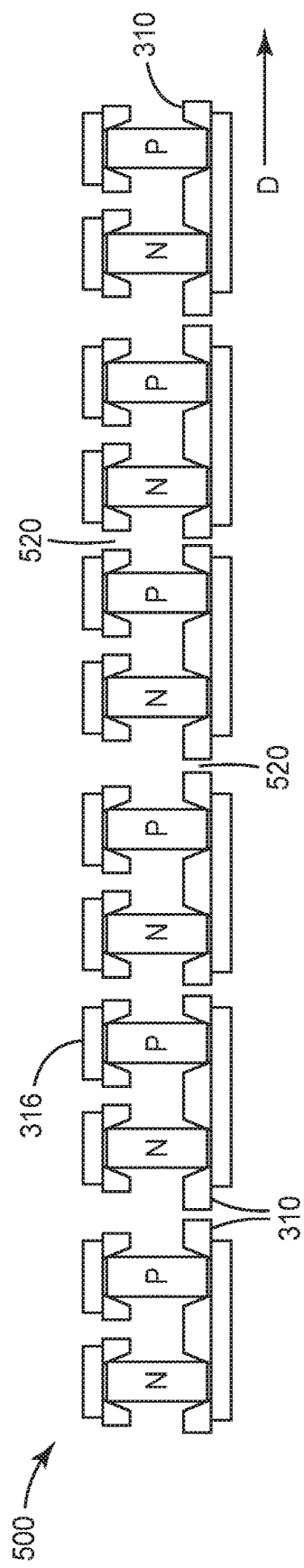
FIG. 5A shows a schematic diagram of a side view of a flexible thermoelectric device according to an example embodiment.

FIG. 5A shows a diagram of the side view of a flexible thermoelectric strip 500 fabricated in accordance with the method 100 according to an example embodiment. The sub-assemblies are joined along a first direction D. In the example embodiment, P- and N-type semiconductor chips are used as the P- and N-type thermoelectric elements. As shown in the figure, portions of PI between adjacent sub-assemblies are etched out to form gaps 520, which can further improve the flexibility of the strip 500.

Figure 5B:
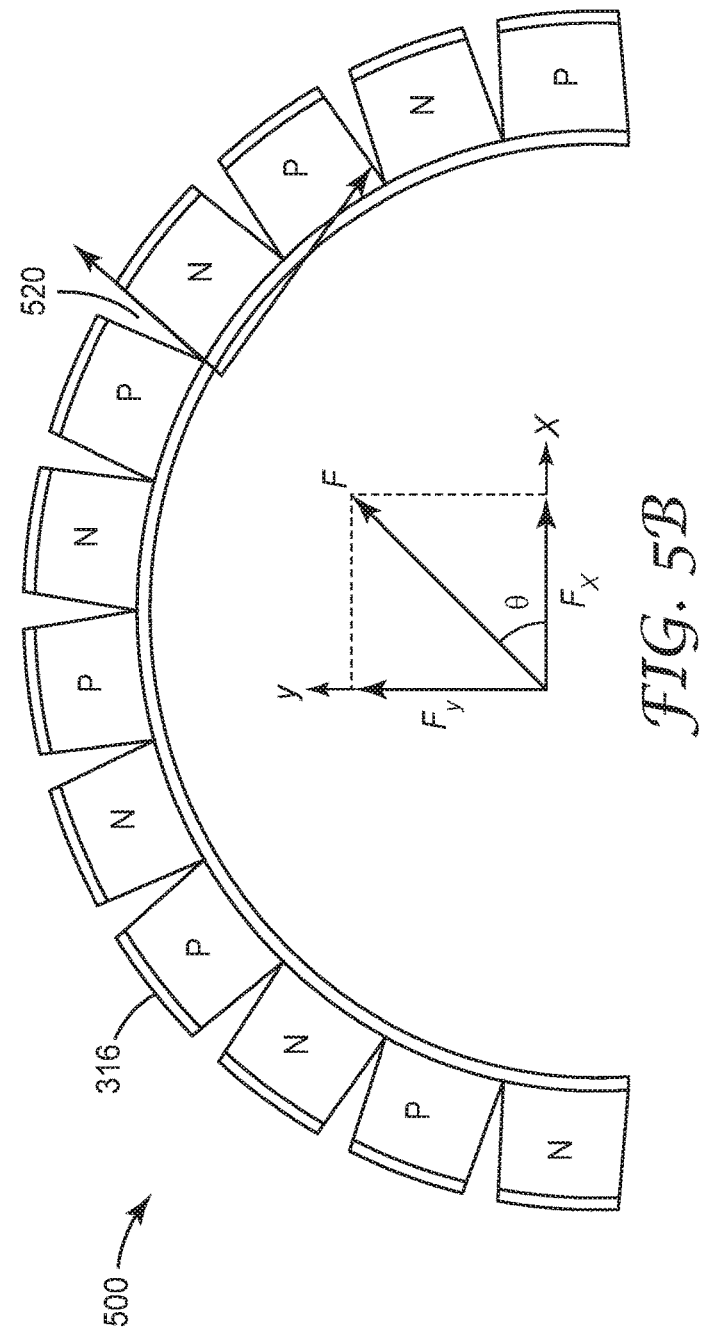
FIG. 5B shows a schematic diagram of the side view of the flexible thermoelectric device of FIG. 5A in a bent form.

FIG. 5B shows a schematic diagram of the side view of a flexible thermoelectric strip 500 in a bent form. As shown in the figure, the gaps 520 advantageously improve the flexibility of the strip 500 when being bent.

Figure 5C:
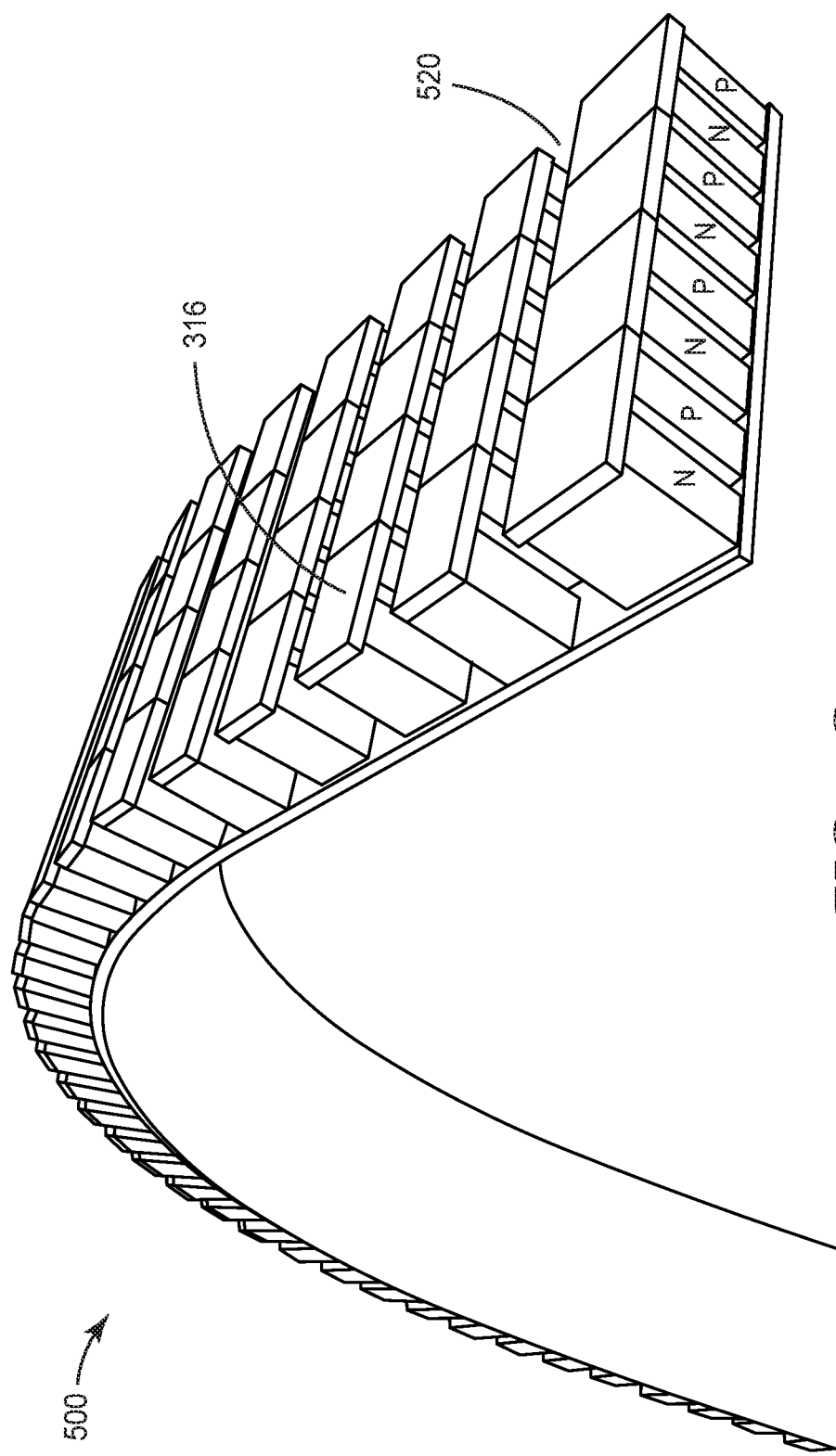
FIG. 5C shows a schematic diagram of the perspective view of the flexible thermoelectric device of FIG. 5A in a bent form.

FIG. 5C shows a schematic diagram of the perspective view of a flexible thermoelectric strip 500. One may note that, for each thermoelectric unit, the P- and N-type semiconductor chips are aligned in a second direction substantially perpendicular to the first direction D. With the layout of the thermoelectric units as described above, the compression and tension forces acting on the P- and N-type semiconductor chips, solder joints and the flexible circuit 316 can be reduced when the strip 500 is bent, which allows better flexibility and durability of the device. The flexibility may be further improved by etching the dielectric layer between two adjacent sub-assemblies joined along the first direction D to create a gap 520. In other words, the gaps 520 are in the second direction substantially perpendicular to the first direction. The dielectric layer can be partially or completely etched. As a result, an array of thermoelectric units in the second direction (i.e. width direction) does not connect to the neighboring arrays of thermoelectric units except at the bottom interconnect layer. In other words, the arrays of thermoelectric units are minimally connected in the first direction, thereby allowing a high flexibility and durability when the strip 500 is bent in a manner shown in FIGS. 5B and 5C.

Figure 6B:
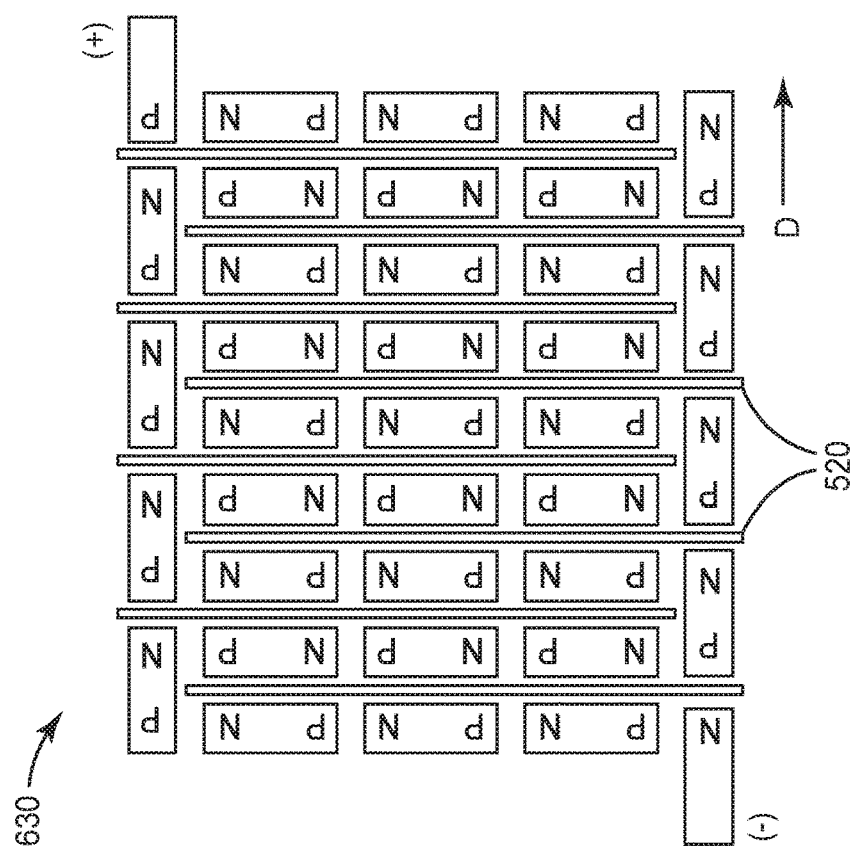
FIG. 6B shows a schematic diagram of the top plan view of a top interconnected layer of the flexible thermoelectric device according to the example embodiment.
Figure 6A:
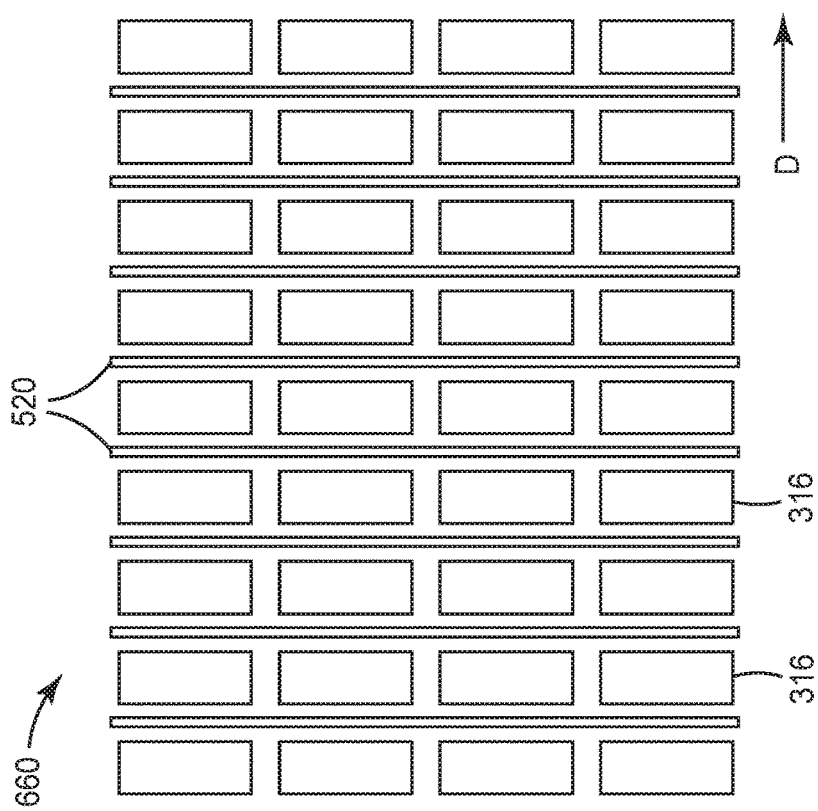
FIG. 6A shows a schematic diagram of the top plan view of a bottom interconnected layer of a flexible thermoelectric device according to an example embodiment.
Figure 6C:
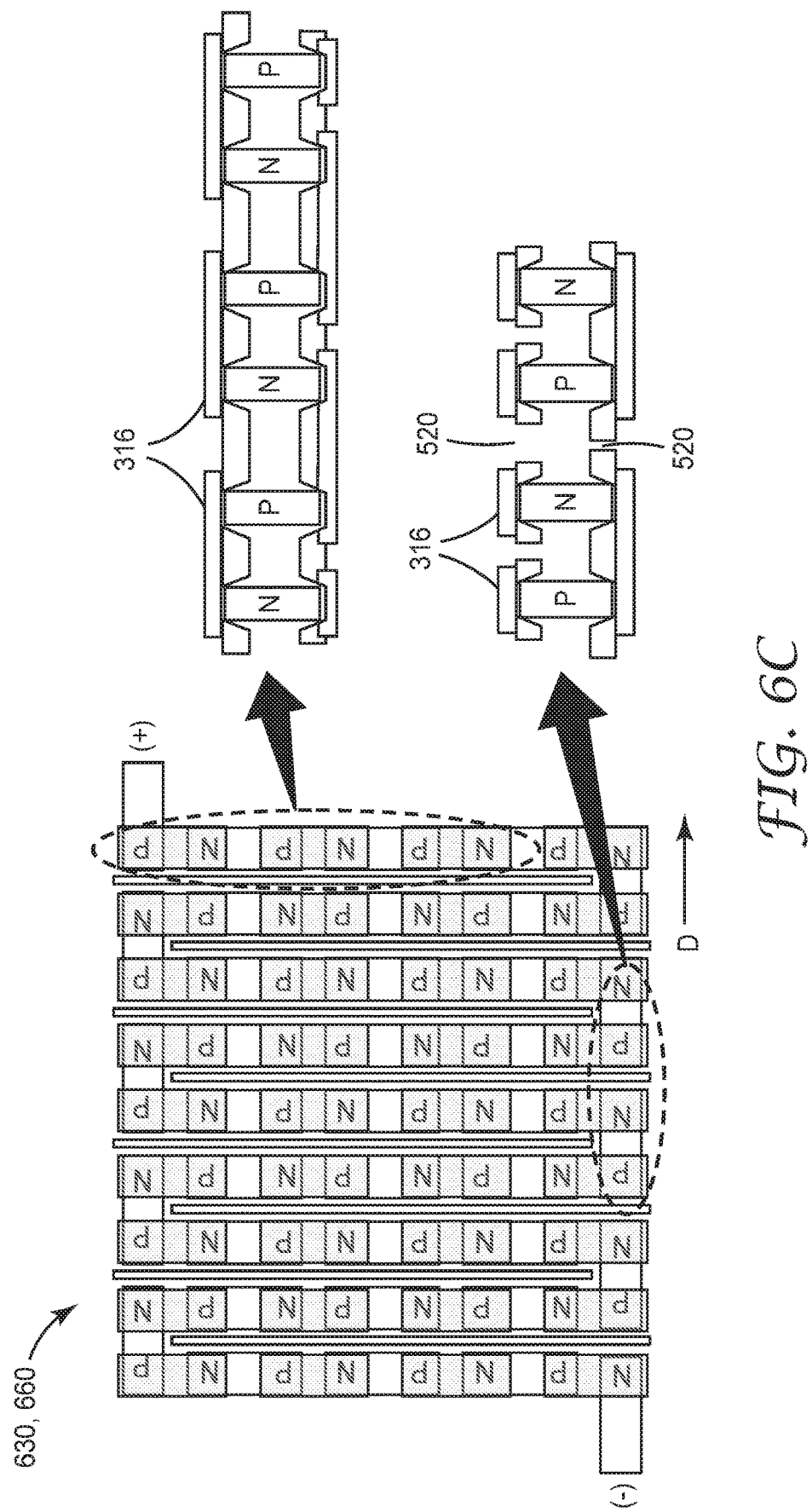
FIG. 6C shows a schematic diagram of an assembly of the bottom interconnected layer of FIG. 6A and the top interconnected layer of FIG. 6B according to the example embodiment.

Referring to FIGS. 6A-6C, an example assembly of a bottom interconnected layer 630 (FIG. 6A) and a top interconnect layer 660 (FIG. 6B) is depicted in accordance with the embodiment. As shown in FIG. 6A, arrays of thermoelectric units are aligned in the second direction on the bottom interconnected layer 630. To connect these arrays of thermoelectric units, two rows of thermoelectric units are provided along the edges of the strip 500 in the first direction. As shown in FIG. 6B, Cu electrodes 316 are arranged in the top interconnect layer 660 to connect the thermoelectric units on the bottom interconnected layer 630. Advantageously, upon assembly, the arrays of thermoelectric units aligned in the second direction are minimally connected in the first direction only along the edges on the bottom interconnected layer (e.g. in a serpentine arrangement as shown in FIG. 6A), such that a very high flexibility of the strip can be achieved. One may appreciate that other ways of assembling the bottom and top interconnected layers can be used, depending on the design of the thermoelectric units on the strip.

Embodiments of the present invention provide a long flexible thermoelectric device with thermoelectric units connected in series. Attributed to its length and flexibility, it can be wrapped around any non-flat surface or tubes with higher diameter. It also allows easier thermal management than the conventional rigid thermoelectric devices which needs to be connected in series.

For example, headgears can be designed to incorporate thermoelectric products to remove heat from the interior to improve the comfort of the wearers. The popularity of motorcycles is on the rise around the globe, especially in hotter countries in Asia. The thermoelectric products can be added into the helmets of riders to transfer heat from the interior of the helmets to surroundings. Further, an additional air filter for the air inlet can be added to address the rising pollution concerns in some areas in Asia. Thermoelectric products can also be inserted into other wearable items such as respirators and clothing for the same purpose. Besides the applications in headgears and apparels, the present invention may have other potential applications, such as in head concussion emergencies, CPU cooling and portable air conditioning units.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of fabricating a thermoelectric device, the method comprising:
    disposing a metal layer on a dielectric layer to form a sub-assembly;
    forming patterned circuits on the metal layer;
    forming a first and second series of blind vias in the dielectric layer;
    fabricating first thermoelectric elements in the first series of blind vias; and
    fabricating second thermoelectric elements in the second series of blind vias to form thermoelectric units comprising pairs of individual first thermoelectric elements and individual second thermoelectric elements electrically coupled via the patterned circuits,
    wherein the sub-assembly is configured to be joined to an adjacent sub-assembly along a first direction, and wherein fabricating the first and second thermoelectric elements comprises aligning the first and second thermoelectric elements of each thermoelectric unit in a second direction substantially perpendicular to the first direction.

2. The method as claimed in claim 1, wherein forming the patterned circuits comprises:
    forming a first patterned photo-resist layer on the metal layer;
    disposing a metal on the metal layer based on the first patterned photo-resist layer; and
    removing the photo-resist layer and non-functional metal from the sub-assembly.

3. The method as claimed in claim 2, wherein forming the first patterned photo-resist layer on the metal layer comprises:
    providing a first photomask; and
    aligning registration spots of the first photomask with corresponding registration holes of the metal layer.

4. The method as claimed in claim 1, wherein forming the blind vias comprises:
    forming a second patterned photo-resist layer on the dielectric layer; and
    removing the dielectric layer.

5. The method as claimed in claim 4, wherein forming the second patterned photo-resist layer on the dielectric layer comprises:
    providing a second photomask; and
    aligning registration spots of the second photomask with corresponding registration holes of the dielectric layer.

6. The method as claimed in claim 1, further comprising joining multiple sub-assemblies to form an assembly extending in the first direction before forming the patterned circuits and blind vias.

7. The method as claimed in claim 6, wherein joining the multiple sub-assemblies comprises aligning markers on an edge of one sub-assembly with corresponding markers on an adjoining edge of another sub-assembly.

8. The method as claimed in claim 6, further comprising forming through vias in the dielectric layer at the step of forming the first and second series of blind vias to form a gap between the two adjacent sub-assemblies.

9. The method as claimed in claim 1, wherein fabricating the first thermoelectric elements in the first series of blind vias and fabricating the second thermoelectric elements in the second series of blind vias comprises screen printing of the first and second thermoelectric elements.

10. The method as claimed in claim 1, further comprising providing metal contacts to connect the thermoelectric units within the sub-assembly in series.

11. The method as claimed in claim 10, wherein ends of adjacent sub-assemblies are connected in series in a serpentine arrangement.

12. The method as claimed in claim 1, wherein the dielectric layer is made of a material selected from a group consisting of polyimide, polyesters, thermoplastic polyimide, polyamide, polyolefin film, liquid crystalline polymer film, and flexible FR4 based film.

13. The method as claimed in claim 1, wherein the first thermoelectric element is made of a material selected from the group consisting of bismuth telluride, silicon germanium, calcium cobalt oxides based materials, sodium cobalt oxides based materials, and strontium titanium oxides based materials.

14. The method as claimed in claim 1, wherein the second thermoelectric element is made of a material selected from the group consisting of antimony telluride, lead tellurides, and $Mg_2X$ (X=Si, Ge, and Sn) based materials.

* * * * *